US008293021B2

(12) United States Patent
Kernig et al.

(10) Patent No.: US 8,293,021 B2

(45) Date of Patent: *Oct. 23, 2012

(54) INSTRUMENT FOR CLEANING AN ALUMINUM WORKPIECE

(75) Inventors: Bernhard Kernig, Köln (DE); Henk-Jan Brinkman, Bonn (DE)

(73) Assignee: Hydro Aluminium Deutschalnd GmbH, Cologne (DE)

( * ) Notice: Subject to any disclaimer, the term of this patent is extended or adjusted under 35 U.S.C. 154(b) by 783 days.

This patent is subject to a terminal disclaimer.

(21) Appl. No.: 12/303,304

(22) PCT Filed: Jun. 6, 2007

(86) PCT No.: PCT/EP2007/055586

§ 371 (c)(1), (2), (4) Date: Feb. 24, 2009

(87) PCT Pub. No.: WO2007/141300

PCT Pub. Date: Dec. 13, 2007

(65) Prior Publication Data

US 2009/0209444 A1 Aug. 20, 2009

(30) Foreign Application Priority Data

Jun. 6, 2006 (EP) .................................... 06115002

(51) Int. Cl.
*G03F 7/09* (2006.01)

(52) U.S. Cl. .......... 134/1.3; 510/175; 510/176; 510/365

(58) Field of Classification Search ................... 510/245

See application file for complete search history.

(56) References Cited

U.S. PATENT DOCUMENTS

| | | | | |
|---|---|---|---|---|
| 4,602,963 | A | 7/1986 | Piatkowski | 134/2 |
| 4,945,004 | A | 7/1990 | Sprintschnik et al. | 428/469 |
| 5,114,607 | A * | 5/1992 | Deck et al. | 510/254 |
| 5,520,841 | A | 5/1996 | Block et al. | 252/174.23 |
| 5,795,541 | A | 8/1998 | Tanigawa et al. | 420/520 |
| 5,997,721 | A | 12/1999 | Limbach et al. | 205/680 |
| 6,447,982 | B1 * | 9/2002 | von Asten et al. | 430/278.1 |

FOREIGN PATENT DOCUMENTS

| | | |
|---|---|---|
| DE | 36 00 415 | 7/1987 |
| DE | 43 17 815 C1 | 6/1994 |
| EP | 0 201 864 | 6/1986 |
| WO | 2006122852 | 11/2006 |

OTHER PUBLICATIONS

International Search Report for International Application No. PCT/EP2007/055586.

* cited by examiner

*Primary Examiner* — Gregory Webb

(74) *Attorney, Agent, or Firm* — Proskauer Rose LLP

(57) ABSTRACT

A method of conditioning the surface of a work piece, in particular of a litho-strip or litho-sheet, consisting of an aluminum alloy enables an increase in manufacturing speed in surface roughening while maintaining a high quality of the electro-chemical grained surface of the work piece with relative low effort related to facility equipment. The method of conditioning comprises at least the step of degreasing the surface of the work piece with a degreasing medium, wherein the degreasing medium contains at least 1.5 to 3% by weight of a composite of 5-40% sodium tripolyphosphate, 3-10% sodium gluconate, 3-8% of a composite of non-ionic and anionic surfactants and optionally 0.5 to 70% soda, wherein sodium hydroxide is added to the degreasing medium such that the concentration of sodium hydroxide in the aqueous degreasing medium is 0.01 to 5% by weight.

7 Claims, 1 Drawing Sheet

INSTRUMENT FOR CLEANING AN ALUMINUM WORKPIECE

CROSS-REFERENCE TO RELATED APPLICATIONS

This application is a National Phase Application of International Application No. PCT/EP2007/055586, filed on Jun. 6, 2007, which claims the benefit of and priority to European patent application no. EP 06 115 002.5, filed Jun. 6, 2006. The disclosure of the above applications are incorporated herein by reference in their entirety.

FIELD OF THE INVENTION

The invention relates to a method of conditioning the surface of a work piece, in particular of a litho-strip or litho-sheet, consisting of an aluminum alloy.

BACKGROUND

Work pieces such as strips or sheets consisting of an aluminum alloy are often surface treated after finishing rolling to prepare them for the next manufacturing step. In particular strips or sheet for lithographic printing are conditioned to achieve a predetermined surface roughness in a subsequent graining process. Litho-strips or sheets are usually degreased after finishing rolling. As known from the US-patent specification U.S. Pat. No. 5,997,721, degreasing respectively cleaning of the surface is done in one step by anodising the aluminum alloy sheet with AC current in an acidic electrolyte bath. Another way to degrease or clean aluminum slivers is known from the German patent DE 43 17 815 C1 namely the use of an alkaline medium. But from the use of alkaline media it is known that they do not remove every features of the subsurface microcrystalline layer, in particular oxide particles, which are present on or near the surface of the rolled aluminum strips.

However, prior electro-chemical graining the litho-strips are usually subjected to sodium hydroxide in a pre-treatment to degrease and clean the surface again, which process together with the electro-chemical graining is herein further called surface roughening process of litho-strips. In principle surface roughening is done by the manufacture of lithographic printing plates. Due to the increasing manufacturing speed of surface roughening of the litho-strips time for the pre-treatment of the surface of the litho-strips and for the electro-chemical graining decreases. It has been found that due to the increasing manufacturing speed the pre-treatment with sodium hydroxide is not sufficient enough to remove all contaminants from the surface of the litho-strip. As a consequence, the results in electro-chemical graining are not stable and surface defects occur on electro-chemically grained litho-strips or sheets. However, a reduction of the manufacturing speed causes higher production costs for lithographic printing plates.

Furthermore, methods of conditioning the surface of a litho-strip including two steps require relative high expenses related to facility equipments.

SUMMARY OF THE INVENTION

Hence, embodiments of the invention feature a method for conditioning the surface of a work piece and a work piece consisting of an aluminum alloy, which enable an increased manufacturing speed in surface roughening and maintain at the same time a high quality of the grained surface of the work piece with relative low effort related to facility equipment.

According to a first teaching of the present invention, a method of conditioning the surface of an aluminum work piece consisting of an aluminum alloy includes at least the step of degreasing the surface of the work piece with a degreasing medium, wherein the aqueous degreasing medium contains at least 1.5 to 3% by weight of a composite of 5-40% sodium tripolyphosphate, 3-10% sodium gluconate, 3-8% of a composite of non-ionic and anionic surfactants and optionally 0.5% to 70% soda, preferably 30-70% soda, wherein sodium hydroxide is added to the aqueous degreasing medium such that the concentration of sodium hydroxide in the aqueous degreasing medium is 0.01 to 5% by weight, preferably 0.1 to 1.5% by weight, more preferably 1 to 2.5% by weight.

It has been surprisingly found that the combination of the use of the degreasing medium together with added sodium hydroxide ensures an increased manufacturing speed during surface roughening including electro-chemical graining with sufficient results despite of the fact that oxide particles are not removed completely during degreasing. The reason for the good results is seen in the fact that due to the addition of sodium hydroxide the degreasing medium has an increased pickling rate which removes more aluminum from the surface at the same time. In combination with the described pretreatment of for example litho-strips it has been surprisingly found that the electro-chemical graining process of litho-strips can be done with a lower charge entry therefore enabling a higher manufacturing speed. While the addition of 0.1% to 1.5% by weight sodium hydroxide is suitable even for lower manufacturing speeds during degreasing, with the addition of 1% to 2.5% by weight sodium hydroxide highest manufacturing speeds during degreasing are achievable ensuring at the same time high manufacturing speeds during plate manufacturing, i.e. during electro-chemical graining. The optional addition of soda in an amount of 0.5-70%, preferably 30 to 70% by weight allows to control pH-value of the degreasing medium.

According to an embodiment of the invention the time of application of the degreasing medium to the surface of the aluminum work piece is at maximum 1 to 7 s, preferably at maximum 2 to 5 s. These application times ensure high production speeds at the same time ensuring that the oxide islands can easily be removed by surface roughening.

To increase pickling effect of the degreasing medium the temperature of the degreasing medium is 50 to 85° C., preferably 65° C. to 75° C.

In some embodiments, the pH-value of the aqueous degreasing medium is from 10 to 14, preferably 10 to 13.5.

According to a next advantageous embodiment, the work piece is a strip or a sheet, in particular a litho-strip or a litho-sheet. In this case the necessary electro-chemical graining process for manufacturing litho-strips or litho-sheets can be accomplished thoroughly within less time and the printing plate manufacturing speed can be increased. Furthermore, the charge entry needed can be reduced while providing a fully grained strip or sheet surface.

More preferably, the inventive conditioning method is accomplished subsequent the manufacturing of a strip, in particular a litho-strip, and the conditioned strip is reeled on a coil. In this case a coil of a conditioned litho-strip can be provided comprising an optimum performance in further surface roughening processes used to manufacture lithographic printing plates.

According to a second teaching of the present invention, a work piece consisting of an aluminum alloy is conditioned by the inventive method. As outlined before, the inventive work piece provides a cleaned surface with an optimum performance for a subsequent electro-chemical graining process.

More preferably, the work piece is a strip or a sheet, in particular a litho-strip or a litho-sheet. Litho-strip or sheets are produced for lithographic printing plates and differ from “normal” sheets due to the aluminum alloy they consist of and their specific thickness, which is typically less than 1 mm, preferably 0.14 to 0.5 mm, more preferably 0.25 to 0.3 mm. Furthermore, the surface of litho-strips and sheets has to be prepared for a roughening process, since manufacturing of lithographic printing plates generally comprises an electro-chemical graining process to prepare the surface of the lithographic printing plates for the printing process. With the inventive sheets or strips, in particular with the inventive litho-sheets or litho-strips, the necessary electro-chemical graining of the surface can be accomplished in shorter time with a reduced charge entry.

Beside an optimized surface of the inventive work piece the mechanical features and an improved graining structure during electro-chemical graining can be provided if the aluminum alloy of the work piece is one of the aluminum alloys AA1050, AA1100, AA3103 or AlMg0.5. These aluminum alloys provide the mechanical strength needed for lithographic printing plates while enabling due to the low amount of alloying constituents a homogeneous graining of the surface. However, work pieces consisting of other aluminum alloys may provide the same advantages.

According to a more preferably embodiment of the inventive work piece or method of conditioning a surface of the work piece, the aluminum alloy contains the following alloying constituents in percent by weight:

| | |
|---|---|
| 0.05%≦ | Si ≦ 0.15%, |
| 0.3%≦ | Fe ≦ 0.4%, |
| | Cu ≦ 0.01%, |
| | Mn ≦ 0.05%, |
| | Mg ≦ 0.01%, |
| | Zn ≦ 0.015%, |
| | Ti ≦ 0.015%, |

impurities each less than 0.005% in sum max. 0.15%, rest Al or

| | |
|---|---|
| 0.05%≦ | Si ≦ 0.25%, |
| 0.30%≦ | Fe ≦ 0.40%, |
| | Cu ≦ 0.04%, |
| | Mn ≦ 0.05%, |
| 0.1%≦ | Mg ≦ 0.3%, |
| | Ti ≦ 0.04% and |

impurities each less than 0.005% in sum max. 0.15%, rest Al or

| | |
|---|---|
| 0.05%≦ | Si ≦ 0.5%, |
| 0.40%≦ | Fe ≦ 1%, |
| | Cu ≦ 0.04%, |
| 0.08%≦ | Mn ≦ 0.3%, |
| 0.05%≦ | Mg ≦ 0.3%, |
| | Ti ≦ 0.04% and |

impurities each less than 0.005% in sum max. 0.15%, rest Al.

Work pieces consisting of one of the three aluminum alloys and conditioned with the inventive method have state of the art mechanical and graining properties, in particular if the work pieces are litho-strips which are grained electro-chemically after conditioning. It was surprisingly observed that in particular the latter aluminum alloys conditioned with the inventive conditioning method show a higher sensitivity in subsequent surface roughening processes. As a result despite of the inventive single step conditioning method, which reduces the expenses for the conditioning equipment significantly, an increase in plate manufacturing speed for litho-strips and sheets is achievable.

BRIEF DESCRIPTION OF THE DRAWINGS

Various embodiments of the invention exist. The description below describes embodiments with reference to the drawings. The drawings show in FIG. 1 provides a microscopic view of the surface of a litho-strip degreased conventionally and FIG. 2 provides a microscopic view of the surface of a litho-strip degreased with the inventive method.

DESCRIPTION

Figure 2:
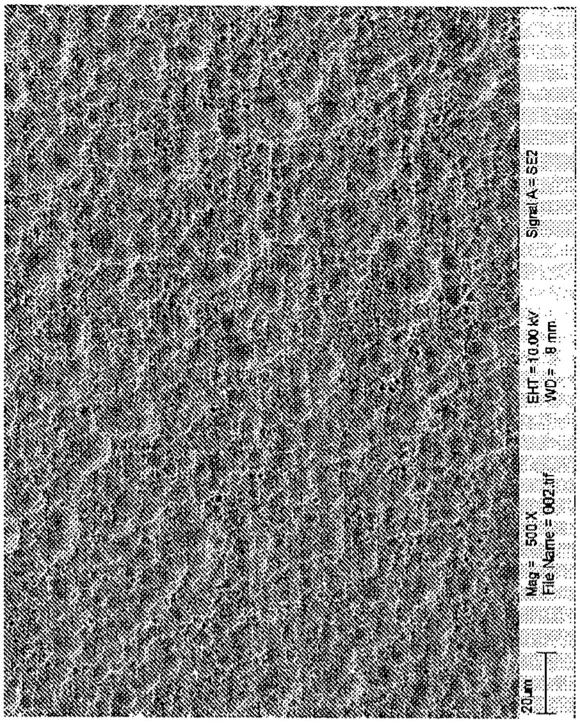

To verify the inventive method four strips made of two different aluminum alloys were tested on the one hand with different degreasing parameters and on the other with different strip velocities during electro-chemical graining on different plate manufacturing lines. The different aluminum alloys have the following compositions of alloying constituents in weight percent:

alloy A:

| | |
|---|---|
| 0.05%≦ | Si ≦ 0.25%, |
| 0.3%≦ | Fe ≦ 0.40%, |
| | Cu ≦ 0.04%, |
| | Mn ≦ 0.05%, |
| 0.1%≦ | Mg ≦ 0.3%, |
| | Ti ≦ 0.04%, and |

impurities each less than 0.005% in sum max. 0.15%, rest Al.

alloy B:

| | |
|---|---|
| 0.05%≦ | Si ≦ 0.15%, |
| 0.3%≦ | Fe ≦ 0.4%, |
| | Cu ≦ 0.01%, |
| | Mn ≦ 0.05%, |
| | Mg ≦ 0.01%, |
| | Zn ≦ 0.015%, |
| | Ti ≦ 0.015%, |

impurities each less than 0.005% in sum max. 0.15%, rest Al.

Litho-strips made from the aluminum alloys mentioned above where tested with regard to their graining behaviour on industrial plate manufacturing lines.

For the inventive examples the degreasing medium used contains at least 1.5 to 3% by weight of a composite of 5 to 40% sodium tripolyphosphate, 3 to 10% sodium gluconate, 30 to 70% soda and 3 to 8% of a composite of non-ionic and anionic surfactants, with an addition of sodium hydroxide in the amount of 1% by weight. The comparative examples were degreased with the same conditions without the addition of sodium hydroxide to the degreasing medium. The results of the examples are shown in table 1

TABLE 1

| Strip | Al Alloy | $T_{Degr.}$ (° C.) | $t_{Degr.}$ (s) | $V_{Graining}$ (m/min.) | Type | Appearance after graining |
|---|---|---|---|---|---|---|
| Strip 1 | A | 75 | 3, 4 | 55 | prior art | 0 |
| | | | | 50 | prior art | + |
| Strip 2 | A | 75 | 3, 4 | 55 | invention | + |
| | | | | 50 | invention | + |
| Strip 3 | B | 75 | 3, 4 | >60 | prior art | 0 |
| Strip 4 | B | 75 | 3, 4 | >60 | invention | ++ |

with $T_{Degr}$ as the temperature during degreasing, $t_{Degr}$ the contact time of the degreasing medium with the strip surface and $V_{Graining}$ the velocity of the strips in the plate manufacturing lines, i.e. the velocity during electro-chemical graining. Strip 1 and 2 produced from one mother strip were tested on the same plate manufacturing line. The same applies to strip 3 and 4. The different values of $V_{Graining}$ for strip 1,2 and strip 3,4 are caused by different characteristics of the plate manufacturing lines.

As can be derived from table 1 the litho-strips degreased with the inventive method generally show a good appearance after electro-chemical graining even if the graining velocity was increased. However, litho-strips degreased with the inventive method show even better graining results, because the surface of the litho-strip grained with the inventive method have a finer, more homogeneous and more shallow graining structure. This graining structure provides improved printing characteristics of the inventive litho-strips. Additionally, the inventive method provides said improved graining structure even at higher manufacturing speeds, as can be derived from the results of strip 1 and strip 2. Strip 1 degreased conventionally shows merely good appearance results after electro-chemical graining at a graining velocity of 50 m/min. However, strip 2 degreased with the inventive method allows 55 m/min graining velocity.

Figure 1:
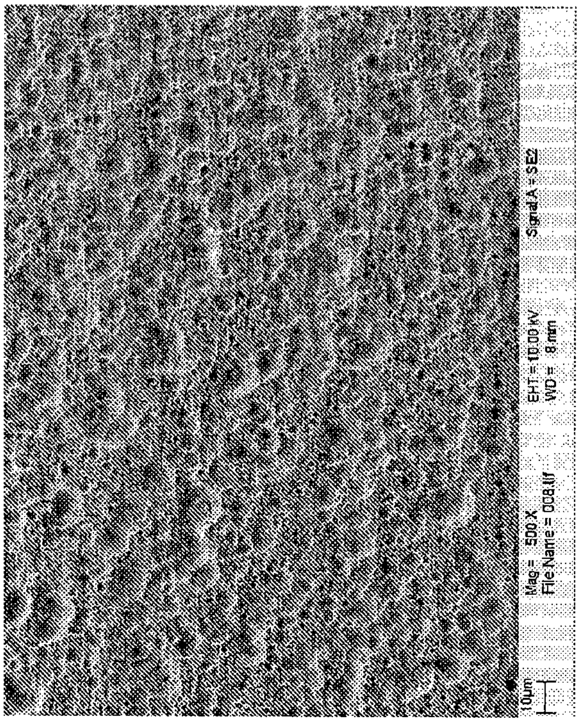

The different graining structures of the conventional and inventive degreasing method are shown in FIG. 1 and FIG. 2. FIG. 2 shows, as already mentioned, a microscopic view of the surface of a litho-strip consisting of the aluminum alloy A degreased with the inventive method after electro-chemical graining. FIG. 1 shows the graining result of the same litho-strip degreased conventionally. The graining pattern achieved with the inventive method is finer and more shallow compared to the graining pattern achieved with a conventionally degreased litho-strip. As a result, the printing characteristics of the inventive litho-strips are improved significantly.

The present embodiments of the invention has been achieved by the addition of 1% per weight sodium hydroxide. It is expected that a higher concentration of sodium hydroxide combined with an decreased contact time of the strip with the degreasing medium will lead to similar results.

The invention claimed is:

1. Method of conditioning a surface of a litho-sheet or litho-strip consisting of an aluminum alloy, the method comprising at least the step of degreasing the surface of the litho-sheet or litho-strip with an aqueous degreasing medium, wherein the aqueous degreasing medium comprises at least 1.5 to 3% by weight of a composite of 5-40% sodium tripolyphosphate, 3-10% sodium gluconate, 3-8% of a composite of non-ionic and anionic surfactants and optionally 0.5-70% soda, wherein the aqueous degreasing medium comprises sodium hydroxide such that a concentration of sodium hydroxide in the aqueous degreasing medium is 0.01 to 5% by weight.

2. Method according to claim 1, wherein time of application of the aqueous degreasing medium is at most 7 s.

3. Method according to claim 1, wherein temperature of the aqueous degreasing medium is 50 to 85° C.

4. Method according to claim 1, wherein pH-value of the aqueous degreasing medium is from 10 to 14.

5. Method according to claim 1, wherein the litho-strip is conditioned subsequently to manufacturing the litho strip.

6. Method according to claim 1, wherein the aluminum alloy is selected from the group consisting of AA1050, AA1100, AA3103 and AlMg0.5.

7. Method according to claim 1, wherein the aluminum alloy includes the following alloying constituents in percent by weight:

| | |
|---|---|
| 0.05%≦ | Si ≦ 0.15%, |
| 0.3%≦ | Fe ≦ 0.4%, |
| | Cu ≦ 0.01%, |
| | Mn ≦ 0.05%, |
| | Mg ≦ 0.01%, |
| | Zn ≦ 0.015%, |
| | Ti ≦ 0.015%, |

impurities individually at most 0.005% in total at most 0.15%, rest Al; or

| | |
|---|---|
| 0.05%≦ | Si ≦ 0.25%, |
| 0.30%≦ | Fe ≦ 0.40%, |
| | Cu ≦ 0.04%, |
| | Mn ≦ 0.05%, |
| 0.1%≦ | Mg ≦ 0.3%, |
| | Ti ≦ 0.04% and |

impurities individually at most 0.005% in total at most 0.15%, rest Al; or

| | |
|---|---|
| 0.05%≦ | Si ≦ 0.5%, |
| 0.40%≦ | Fe ≦ 1%, |
| | Cu ≦ 0.04%, |
| 0.08%≦ | Mn ≦ 0.3%, |
| 0.05%≦ | Mg ≦ 0.3%, |
| | Ti ≦ 0.04% and |

impurities individually at most 0.005% in total at most 0.15%, rest Al.

* * * * *

UNITED STATES PATENT AND TRADEMARK OFFICE

CERTIFICATE OF CORRECTION

PATENT NO. : 8,293,021 B2
APPLICATION NO. : 12/303304
DATED : October 23, 2012
INVENTOR(S) : Kernig et al.

It is certified that error appears in the above-identified patent and that said Letters Patent is hereby corrected as shown below:

On the Title Page:

Item (73) Assignee: Hydro Aluminium Deutschalnd GmbH, Cologne (DE)

should be: Hydro Aluminium Deutschland GmbH, Köln (DE)

Signed and Sealed this
Eighteenth Day of December, 2012

David J. Kappos
*Director of the United States Patent and Trademark Office*